US012665107B2

(12) United States Patent
Hopkinson et al.

(10) Patent No.: US 12,665,107 B2
(45) Date of Patent: Jun. 23, 2026

(54) DATA AND HIGH VOLTAGE POWER NETWORK WITH CONSOLIDATED ENCLOSURE

(71) Applicant: CommScope Technologies LLC, Claremont, NC (US)

(72) Inventors: Wayne Hopkinson, Hickory, NC (US); Ronna Davis, Henderson, NV (US); Scott Keith, Plano, TX (US); Jeffrey Oberski, Lucas, TX (US)

(73) Assignee: CommScope Technologies LLC, Claremont, NC (US)

( * ) Notice: Subject to any disclaimer, the term of this patent is extended or adjusted under 35 U.S.C. 154(b) by 102 days.

(21) Appl. No.: 18/759,412

(22) Filed: Jun. 28, 2024

(65) Prior Publication Data

US 2024/0355508 A1      Oct. 24, 2024

Related U.S. Application Data

(63) Continuation of application No. PCT/US2022/053878, filed on Dec. 22, 2022.

(60) Provisional application No. 63/405,190, filed on Sep. 9, 2022, provisional application No. 63/295,624, filed on Dec. 31, 2021.

(51) Int. Cl.
*H01B 9/00* (2006.01)
*H05K 7/14* (2006.01)

(52) U.S. Cl.
CPC .............. *H01B 9/005* (2013.01); *H05K 7/14* (2013.01)

(58) Field of Classification Search
CPC ........ H01B 9/005; H04B 10/808; H05K 5/10; H05K 7/20736; H04L 49/30; H04L 49/405
See application file for complete search history.

(56) References Cited

U.S. PATENT DOCUMENTS

| | | | | | |
|---|---|---|---|---|---|
| 5,568,362 | A | * | 10/1996 | Hansson | ................ H02B 1/305 |
| | | | | | 439/942 |
| 6,044,194 | A | | 3/2000 | Meyerhoefer | |
| 6,271,476 | B1 | | 8/2001 | Bobowick et al. | |
| 6,535,681 | B2 | | 3/2003 | Daoud et al. | |

(Continued)

FOREIGN PATENT DOCUMENTS

EP            3518461 A1      7/2019

*Primary Examiner* — Sagar Shrestha
*Assistant Examiner* — Peter Krim
(74) *Attorney, Agent, or Firm* — Muncy, Geissler, Olds & Lowe, P.C.

(57) ABSTRACT

A network architecture and a ceiling-mounted enclosure for an office building allows end user devices far from a main equipment room to communicate with servers and outside provider services available within the equipment room. Network cabling includes at least one optical fiber to establish communication between the equipment room and the enclosure and electrical conductors to carry high voltage pulses, exceeding 300 Volts DC, from the equipment room to the enclosure. The enclosure includes a power connection compartment to terminate the high-voltage, a power conversion compartment housing power conversion equipment to convert the high voltage into a lower voltage DC output and/or an AC power output, and a data connection compartment housing data communication equipment to establish communication between the at least one optical fiber and a plurality of ports for twisted pair cable connectors.

16 Claims, 9 Drawing Sheets

(56) References Cited

U.S. PATENT DOCUMENTS

| 6,546,179 | B2 | | 4/2003 | Petri | |
|---|---|---|---|---|---|
| 6,603,660 | B1 | * | 8/2003 | Ehn | H04Q 1/14 |
| | | | | | 361/695 |
| 8,781,637 | B2 | | 7/2014 | Eaves | |
| 9,146,375 | B2 | | 9/2015 | Terry et al. | |
| 9,184,795 | B2 | | 11/2015 | Eaves | |
| 9,419,436 | B2 | | 8/2016 | Eaves et al. | |
| 9,853,689 | B2 | | 12/2017 | Eaves | |
| 9,893,521 | B2 | | 2/2018 | Lowe et al. | |
| 10,468,879 | B2 | | 11/2019 | Eaves | |
| 10,541,543 | B2 | | 1/2020 | Eaves | |
| 10,714,930 | B1 | | 7/2020 | Weiss et al. | |
| 10,855,381 | B2 | | 12/2020 | Sipes, Jr. | |
| 2014/0103790 | A1 | * | 4/2014 | Isaacks | H02G 3/00 |
| | | | | | 312/326 |
| 2016/0111877 | A1 | * | 4/2016 | Eaves | H02J 13/00007 |
| | | | | | 375/257 |
| 2017/0229886 | A1 | | 8/2017 | Eaves | |
| 2018/0313886 | A1 | | 11/2018 | Mlyniec et al. | |
| 2020/0295559 | A1 | | 9/2020 | Eaves et al. | |
| 2021/0063447 | A1 | | 3/2021 | Eaves | |
| 2021/0075326 | A1 | * | 3/2021 | Long | H02J 1/102 |

* cited by examiner

DATA AND HIGH VOLTAGE POWER NETWORK WITH CONSOLIDATED ENCLOSURE

This application is a continuation of International Application No. PCT/US2022/053878, filed Dec. 22, 2022, which claims the benefit of U.S. Provisional Application No. 63/405,190, filed Sep. 9, 2022 and U.S. Provisional Application No. 63/295,624, filed Dec. 31, 2021, all of which are herein incorporated by reference.

BACKGROUND OF THE INVENTION

1. Field of the Invention

The present invention generally relates to a network architecture for an office building to establish a consolidation point which communicates with, and receives power from, an equipment room. More particularly, the present invention relates to a ceiling-mounted enclosure with compartments to terminate high voltage DC pulsing power, to convert the high voltage pulsing power to a lower voltage signal, and to house networking interconnection equipment powered by the lower voltage signal.

2. Description of the Related Art

A typical large office building, or complex of office buildings, has network ports, e.g., RJ45 wall jacks, located throughout the individual offices and meeting rooms on the many floors of the building or complex of buildings. Typically, a main equipment room is located on the first floor or in a basement. The main equipment room has an upgraded HVAC system and a backup power system, such as a battery bank and/or a fossil-fueled backup power generator connection. Outside communication cables from one or more service providers, e.g., Internet, telephone, dedicated alarm and security monitoring services, etc., enter the main equipment room.

Inside the main equipment room, network racks support various servers, switches, patch panels or other related communication devices. The communication devices are powered by the utility power and backed-up power source, should the utility power cease to operate. The communication devices are also connected to network cabling which passes through the walls, floors, ceilings and/or ductwork of the office building to the various wall jacks and ceiling mounted devices such as wireless access points distributed throughout the office building.

There are limits to the maximum length of the network cables connecting the main equipment room to the wall jacks throughout the building. For example, twisted pair cabling used to connect the main equipment room to an RJ-45 wall jack typically does not exceed a few hundred feet, depending upon the category rating of the cabling. This is because data errors become frequent and troublesome with longer cables, due to factors like attenuation, delay skew, and/or internal/alien crosstalk. Also, a power over ethernet (PoE) signal suffers voltage drop over longer runs of twisted pair cable and can no longer provide sufficient power to a device connected to an RJ-45 wall jack.

In larger office buildings or complexes, a common solution is to provide one or more subordinate equipment rooms, e.g., equipment closets located on the fourth and seventh floors of the building and/or in an adjacent building of an office building complex. One or more optical fibers link the main equipment room to the subordinate equipment rooms, such that the subordinate equipment rooms can communicate with the servers and outside provider connections available in the main equipment room. The servers, incoming data modems and backup power sources remain in the main equipment room. However, in each subordinate equipment room, a network rack will support one or more powered switches. The powered switches translate optical data into electrical data and vice versa to service multiple RJ45 ports within the powered switches and to optionally provide a power over ethernet (POE) signal to the RJ45 ports. These RJ45 data ports will be connected, e.g., by twisted pair cabling passing through the ceilings, floors, walls and/or ducts to the RJ-45 wall jacks in the offices and meeting rooms served by the subordinate equipment room.

SUMMARY OF THE INVENTION

The Applicant has appreciated some drawbacks in the network cabling architecture described above. A subordinate equipment room needs to have a back-up power supply if communication is to remain available to the end user devices connected to the wall mounted RJ45 jacks or ceiling mounted devices served by the subordinate equipment room during a utility outage. This can be particularly important, if not required, when maintaining 911 emergency calling capabilities for VoIP phones, the ability to complete commerce transactions, security camera monitoring, fire and burglary alarm sensor support, etc.

Providing a backup power system to each subordinate equipment room is expensive. Also, a backup power system consumes additional power and generates heat, e.g., during a battery charging cycle. Therefore, additional HVAC duct work or equipment may be needed to cool the subordinate equipment room. Further, the added power requirements of the additional HVAC equipment, backup power supply equipment and powered switches may not be locally available to the subordinate equipment room, and might require a power upgrade, e.g., the installation of an electrical subpanel, to service the subordinate equipment room.

Another solution is to run an electrical cable from the main equipment room to the subordinate equipment room, and to directly supply the backed-up power source in the main equipment room to the subordinate equipment room. Unfortunately, this solution has two major drawbacks.

First, by default the subordinate equipment room is several hundred, if not a thousand feet or more, from the main equipment room, otherwise the main equipment room would be servicing the wall jacks being serviced by the subordinate equipment room. The voltage will drop significantly over smaller gauge electrical conductors, like the 12 AWG conductors typically used to power wall outlets. Therefore, large gauge conductors, which are very expense, e.g., 4 or 2 AWG or larger gauge conductors, will be required to avoid excessive voltage drop.

Second, building/fire codes will require such large gauge conductors to be housed within a conduit and may forbid the routing of the conductors through a ceiling space and/or ductwork, and may require closely spaced clamps to hold the conduit to building support structures. These added costs will most likely make the solution of routing power from the equipment room to the subordinate equipment room more expensive than establishing backup power systems and/or HVAC cooling systems in the subordination equipment rooms.

The Applicant has appreciated a new consolidation point-based network architecture, which should solve many of the cost drawbacks of establishing a subordinate equipment room, as found in the network cabling architecture described above. First, the fiber optic cable which connects the main equipment room to the subordinate equipment room can be replaced by a hybrid cable having both optical fibers and electrical current carrying wires, such as 12 gauge wires, although other gauges like 10 gauge or 14 gauge wires may also be possible, such as in the range of 10 to 24 AWG. The voltage in the equipment room is stepped up to a value exceeding 300 volts DC, such as about 400 volts DC. At such high voltages, low amperages are needed to transfer sufficient power (volts times amps) from the source to the destination.

A particularly safe way to transfer high voltage power from a source to a destination is under development and will be known as "class 4" power or "digital voltage." Class 4 power sends rapid pulses of the high voltage DC current, e.g., 400 volts. The destination receives the pulses, which may be reduced due to some voltage drop over the long transmission line, e.g. reduced to 380 volts. The destination has equipment to convert the received DC voltage pulses into a new supply voltage which is suitable for the equipment at the destination, e.g., a 240 volt or 120 volt AC signal or a 5, 12, 24, 48 or 54 volt DC signal. If any irregularity occurs in the pulses between the source and destination, e.g., due to an intermittent short or open circuit condition, the source immediately, e.g. within a few milliseconds, stops sending the high voltage DC voltage pulses to avoid an unsafe condition.

Several background art references show systems for providing safe, high voltage pulses, e.g., exceeding 300 VDC. Such background art can be found in U.S. Pat. Nos. 8,781, 637; 9,184,795; 9,419,436; 9,853,689; 9,893,521; 10,468, 879; 10,541,543 and 10,714,930, and in US Published Application Nos. 2017/0229886; 2018/0313886; 2020/0295559 and 2021/0063447, which are owned by VoltServer of East Greenwich, Rhode Island, and are herein incorporated by reference.

Using this system to supply backed-up power from the main equipment room to the subordinate equipment room negates the need for a backup power supply at the subordinate equipment room. All that is needed is powered switches. The Applicant has also invented a ceiling-mounted enclosure to serve as a consolidation point, which can receive the hybrid fiber and power cable.

The ceiling-mounted enclosure advantageously occupies no real estate on the office floor and is sized to match the spacing of standard drop ceiling panels, e.g., two feet by two feet. The enclosure has three compartments. A first compartment is accessible to the field technician and allows the power conductors of the hybrid cable to be terminated to power terminals, and the optic fibers of the hybrid cable to pass into a third compartment. A second compartment houses power conversion equipment, which is not user serviceable and is therefore not accessible to the technician. The power conversion equipment accepts the high voltage pulses and feeds power ports located in the third compartment, such as 240, 208 or 120 volt AC outlets and 54, 48, 24, 12 and/or 5 volts DC ports.

The third compartment has a small network rack to hold powered switches. The switches receive power from the 240, 208 or 120 volt AC outlets, or 54, 48, 24, 12, or 5 VDC outlets, bidirectionally communicate with the optical fibers of the hybrid cable and bidirectionally communicate via twisted pair ports of the RJ45 type to cabling connected to the RJ45 wall jacks and ceiling mounted devices served by the consolidation point. The third compartment may include a hinged lower door to access the powered switches from a ladder below the ceiling-mounted enclosure, and may optionally include a side access panel to access the third compartment laterally from above a plane of the ceiling tiles. The third compartment may also have one or more thermostat-controlled fans to circulate air through the second and third compartments to cool power conversion equipment and the powered switches. The fans may be structurally mounted to the second compartment to direct the air flow through the second and third compartments.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF EMBODIMENTS OF THE INVENTION

Figure 1:
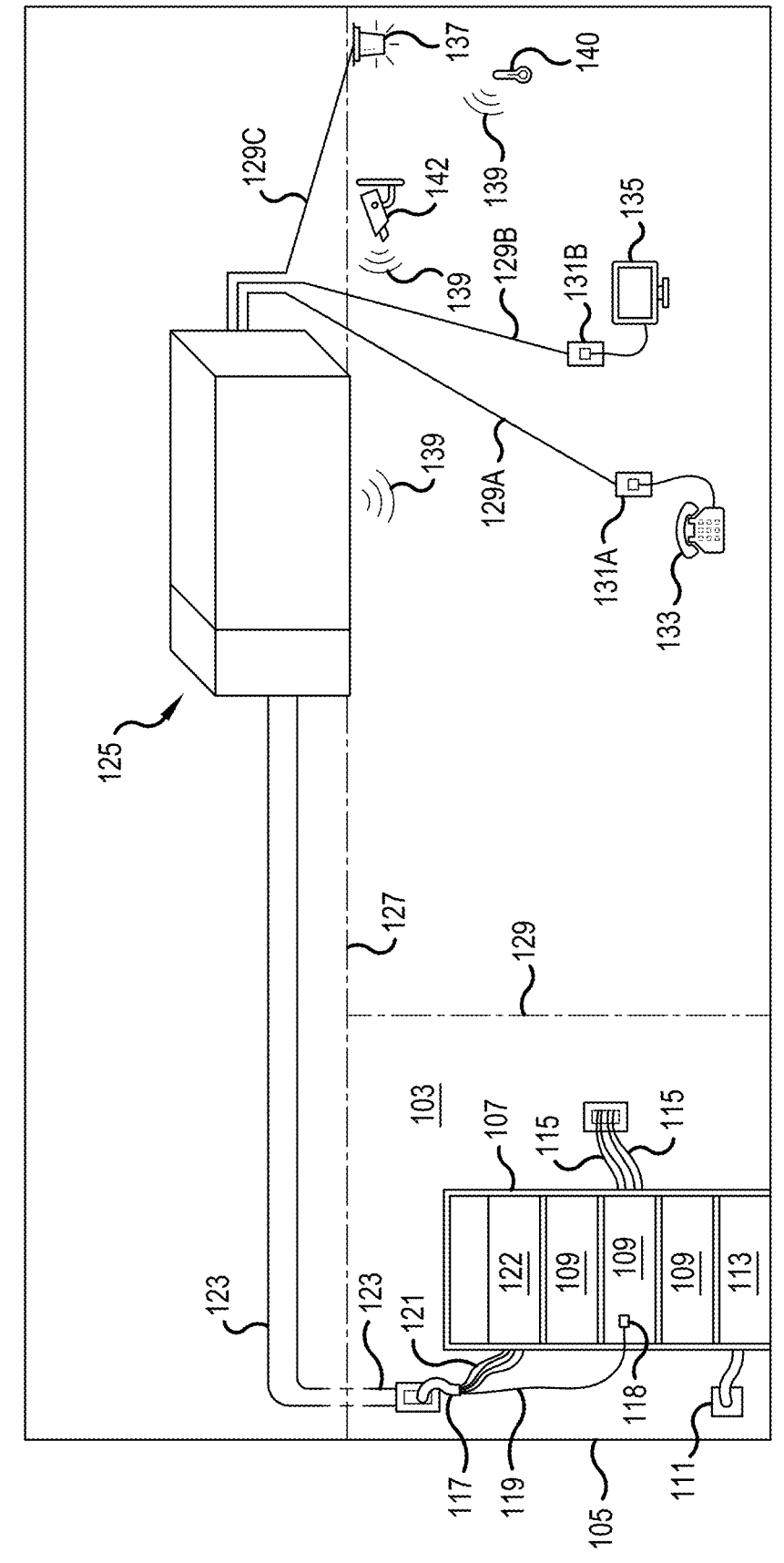
FIG. 1 is a diagram showing a main equipment room, a ceiling-mounted enclosure and a hybrid cable connection, according to the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

FIG. 1 is a diagram of a consolidation point-based network architecture 101. A main equipment room 103 is placed on a first floor or basement of an office building 105. The main equipment room 103 includes at least one network rack 107. The network rack 107 supports communication devices 109, such as servers, switches, patch panels and/or other related devices. The communication devices 109 are powered by the utility power 111 and a backup power supply 113, such as a battery bank.

One or more outside communication cables 115 from one or more service providers enter the main equipment room 103 to provide service provider communication links, e.g., Internet, telephone, dedicated alarm services and security monitoring services. The outside communication cables 115 are connected to one or more of the communication devices 109, which act as a communications hub. A hybrid cable 117, having both optical fiber cable subunits 119 and insulated electrical conductors 121 for carrying electric power, enters the main equipment room 103. At a first end of the hybrid cable 117, the fiber cable subunits 119 have their optic fibers terminated to an optical connector 118, e.g., an MPO connector, which is connected to the communication devices 109.

The electrical conductors 121 at the first end of the hybrid cable 117 are connected to a high voltage source 122, such as a class 4 power or "digital voltage" producing device, which produces DC voltage pulses in excess of 300 volts. The high voltage source 122 is typically powered by the utility power 111, e.g., line voltage of 120 or 240 volts AC. However, the backup power supply 113 is functional so that the DC voltage pulses in excess of 300 volts continue to be supplied to the electrical conductors 121 at the first end of said hybrid cable 117, even if the line voltage of 120 or 240 volts AC is interrupted.

The hybrid cable 117 may be routed through a conduit 123 to a remote location, where a second end of the hybrid cable 117 is terminated within a ceiling mounted enclosure 125. In some localities and/or situations, it may be possible to route the hybrid cable 117 to the remote location without the use of a conduit 123 if local building codes allow such an arrangement. In FIG. 1, the horizontal dash-dot-dash line 127 may represent several floors in the office building 105, such as about five floors or more, or about fifty feet or more. The vertical dash-dot-dash line 129 represents several room divider walls in the office building 105, such as about twenty divider walls or more, or about three hundred feet or more. In other words, in the depicted embodiment, the hybrid cable 117 has a length of about three hundred fifty feet or more.

The ceiling mounted enclosure 125 may include wired connections to establish communications with plural devices in the general area of the ceiling mounted enclosure 125. The general area of the ceiling mounted enclosure 125 may be considered as one to a few hundred feet from the ceiling mounted enclosure 125. For example, twisted pair cables 129A and 129B may provide two-way data communication, and optionally power over ethernet (POE), to wall jacks 131A and 131B. The wall jacks 131A and 131B may establish communication with, and optionally provide power to, devices, like a telephone 133, a display 135, a laptop, a printer, a fax machine, etc. A power cable 129C may provide power upon a predetermined condition to a light 137, such as an alarm light or stairway/exit illumination light in the case of an emergency.

The ceiling mounted enclosure 125 may include devices to send and receive wireless connection signals 139 to establish communications with plural communication devices in the general area of the ceiling mounted enclosure 125, such as a thermostat 140 and a security camera 142 or a cell phone. The wireless signal 139 may be Wi-Fi, Bluetooth, 4G, 5G or any other known wireless signal type.

Figure 2:
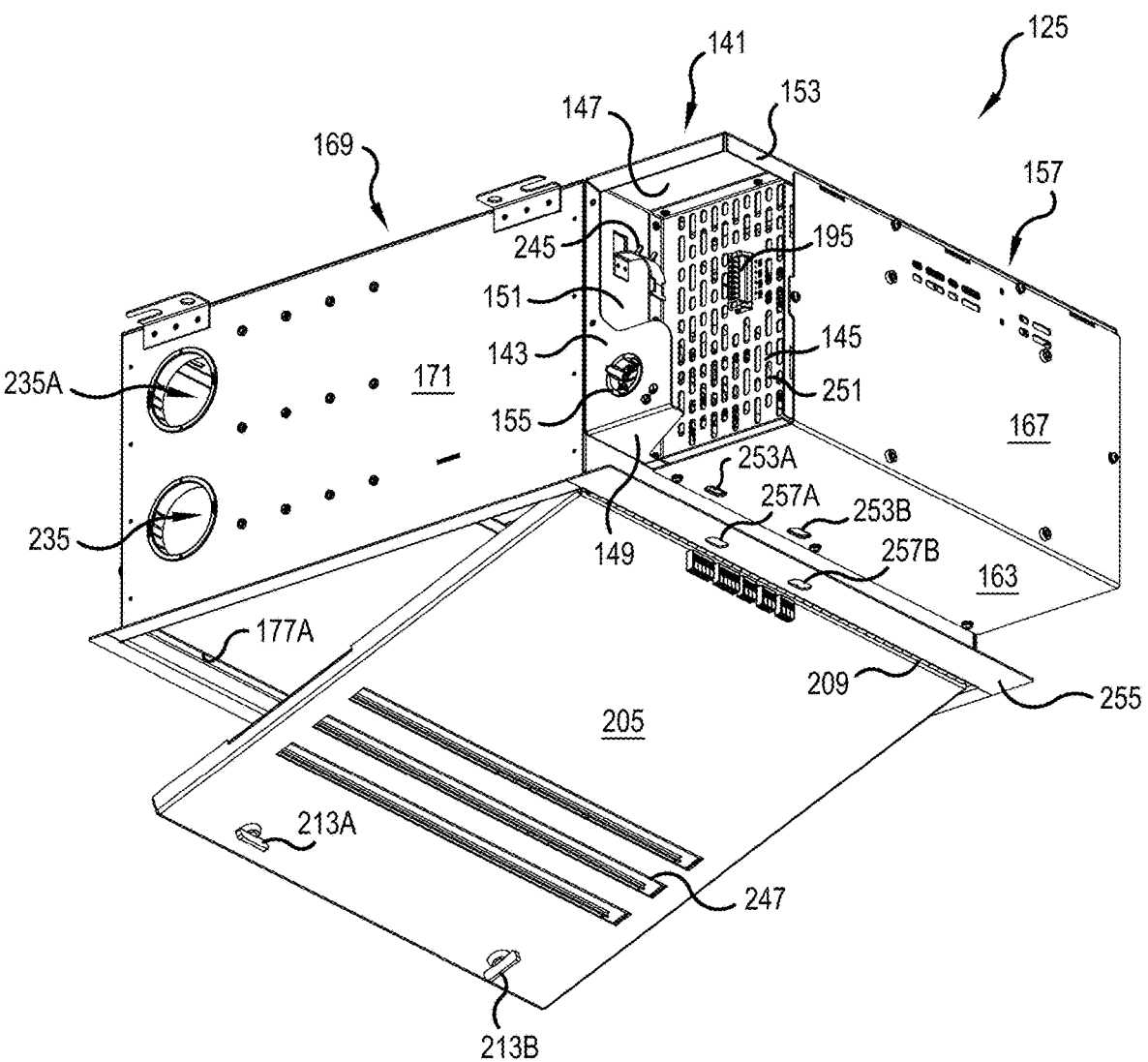
FIG. 2 is a rear, bottom and first side perspective view illustrating a power connection compartment, a power conversion compartment and a data connection compartment of the enclosure of FIG. 1, with a cover to the power connection compartment removed.
Figure 3:
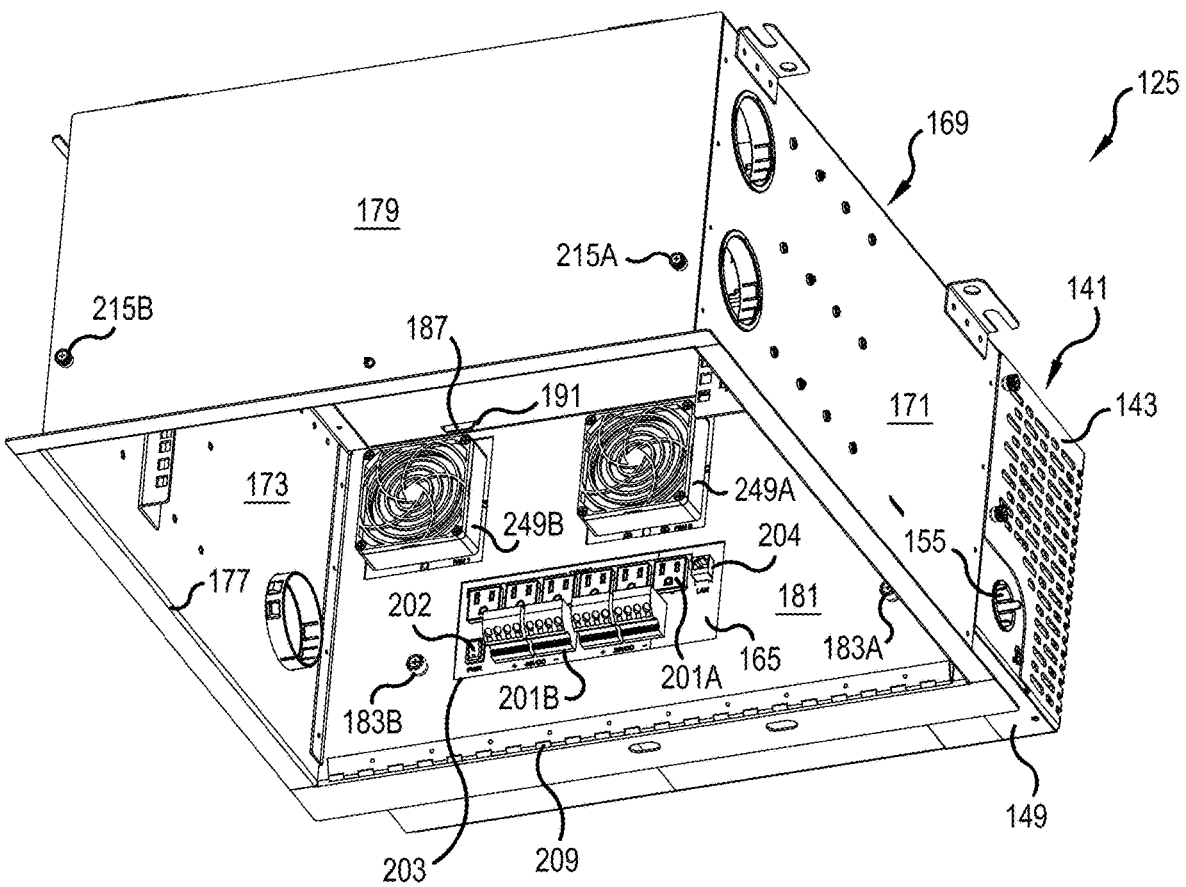
FIG. 3 is a front, bottom and first side perspective view of the enclosure of FIG. 1, with an access door removed.
Figure 4A:
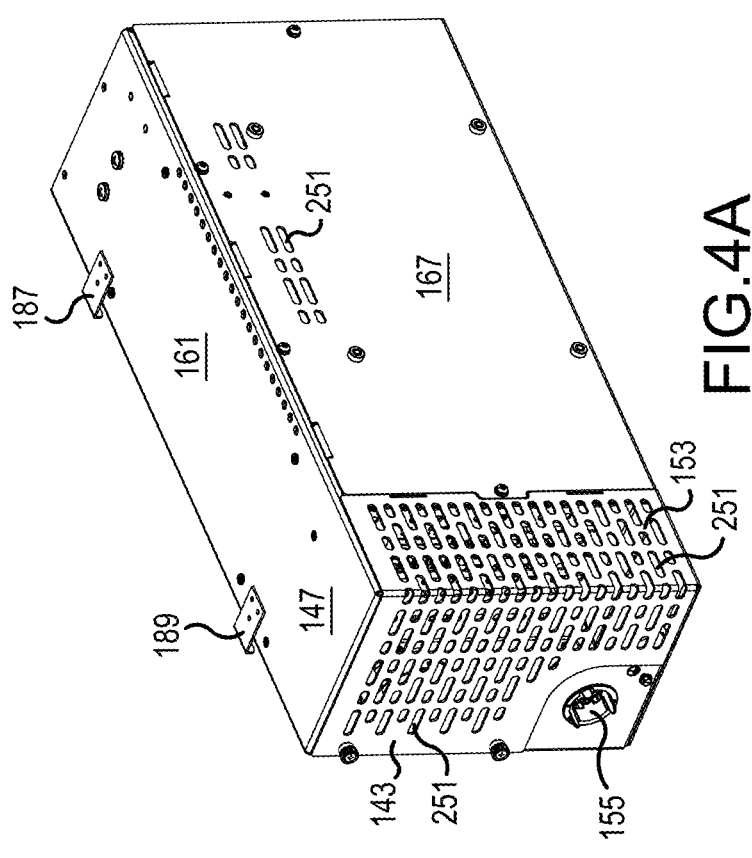
FIG. 4A is a rear, top and first side perspective view of the power connection compartment and power conversion compartment separated from the data connection compartment.
Figure 4:
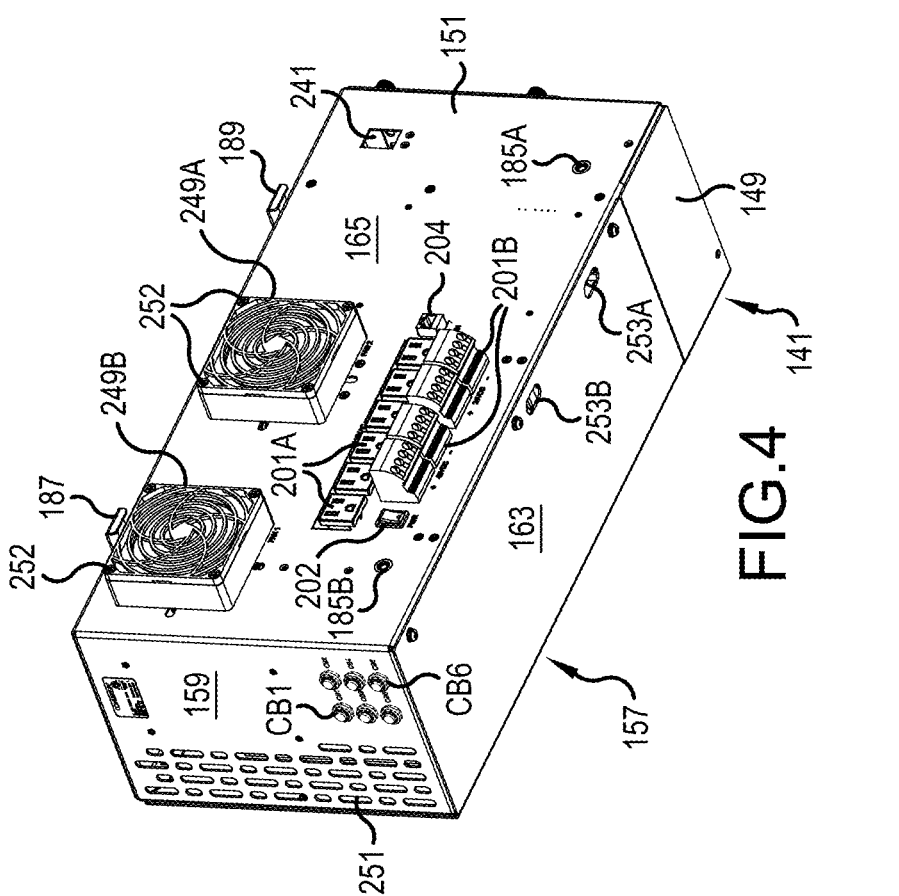
FIG. 4 is a front, bottom and second side perspective view of the power connection compartment and power conversion compartment separated from the data connection compartment.

Now with reference to FIGS. 2-4, a more detail description of the ceiling mounted enclosure 125, in accordance with the present invention will be made. FIG. 2 is a rear, bottom and first side perspective view illustrating a power connection compartment 141, a power conversion compartment 157 and a data connection compartment 169 of the enclosure 125. FIG. 3 is a front, bottom and first side perspective view of the enclosure 125. FIG. 4 is a front, bottom and second side perspective view of the power connection compartment 141 and power conversion compartment 157, when separated from the data connection compartment 169. FIG. 4A is a back, top and first side perspective view of the power connection compartment 141 and power conversion compartment 157, when separated from the data connection compartment 169.

The power connection compartment 141 has a first volume defined within a first plurality of walls. The first plurality of walls includes a first sidewall 143, an opposite, second sidewall 145, a top wall 147, a bottom wall 149, a front wall 151 and a back wall 153. The first sidewall 143 may be considered an entrance wall 143, which includes an opening 155 to receive the second end of the hybrid cable 117. The second sidewall 145 may be considered a first partitioning wall 145, as it acts to separate the power connection compartment 141 from the power conversion compartment 157, as best seen in FIG. 2.

The power conversion compartment 157 has a second volume defined within a second plurality of walls. The second plurality of walls includes the first partitioning wall 145 (forming a first sidewall), an opposite, second sidewall 159, a top wall 161, a bottom wall 163, a front wall 165 and a back wall 167. The front wall 165 may be considered a second partitioning wall 165, as it assists to separate the power conversion compartment 157 from the data connection compartment 169.

The data connection compartment 169 has a third volume defined within a third plurality of walls. The third plurality of walls includes a first sidewall 171, an opposite, second sidewall 173, a top wall 175, a bottom wall 177, a front wall 179 and a back wall 181. When the enclosure 125 is assembled, the back wall 181 of the data connection compartment 169 may abut the second partitioning wall 165 of the power conversion compartment 157 and also abut the front wall 151 of the power connection compartment 141.

In FIG. 4, the power connection compartment 141, combined with the power conversion compartment 157, has been separated from the data connection compartment 169. The separation may be accomplished by removing one or more threaded fasteners, such as first and second threaded fasteners 183A and 183B (heads of which abut the rear wall 181 of the data connection compartment 169, see FIG. 3) from first and second threaded bore holes 185A and 185B formed in the front wall 165 of the power conversion compartment 157 and/or front wall 151 of the power connection compartment 141. The first and second threaded fasteners 183A and 183B may have an enlarged knurled head to enable finger manipulation for tool-less tightening and loosening. Once the first and second threaded fasteners 183A and 183B are removed, the power conversion compartment 157 and power connection compartment 141 may be removed as a unit by siding the two upward relative to the data connection compartment 169. Doing so, will cause first and second tabs or hooks 187 and 189 to slide out of first and second slots 191 and 193, formed in the top wall 175 of the data connection compartment 169.

Figure 5:
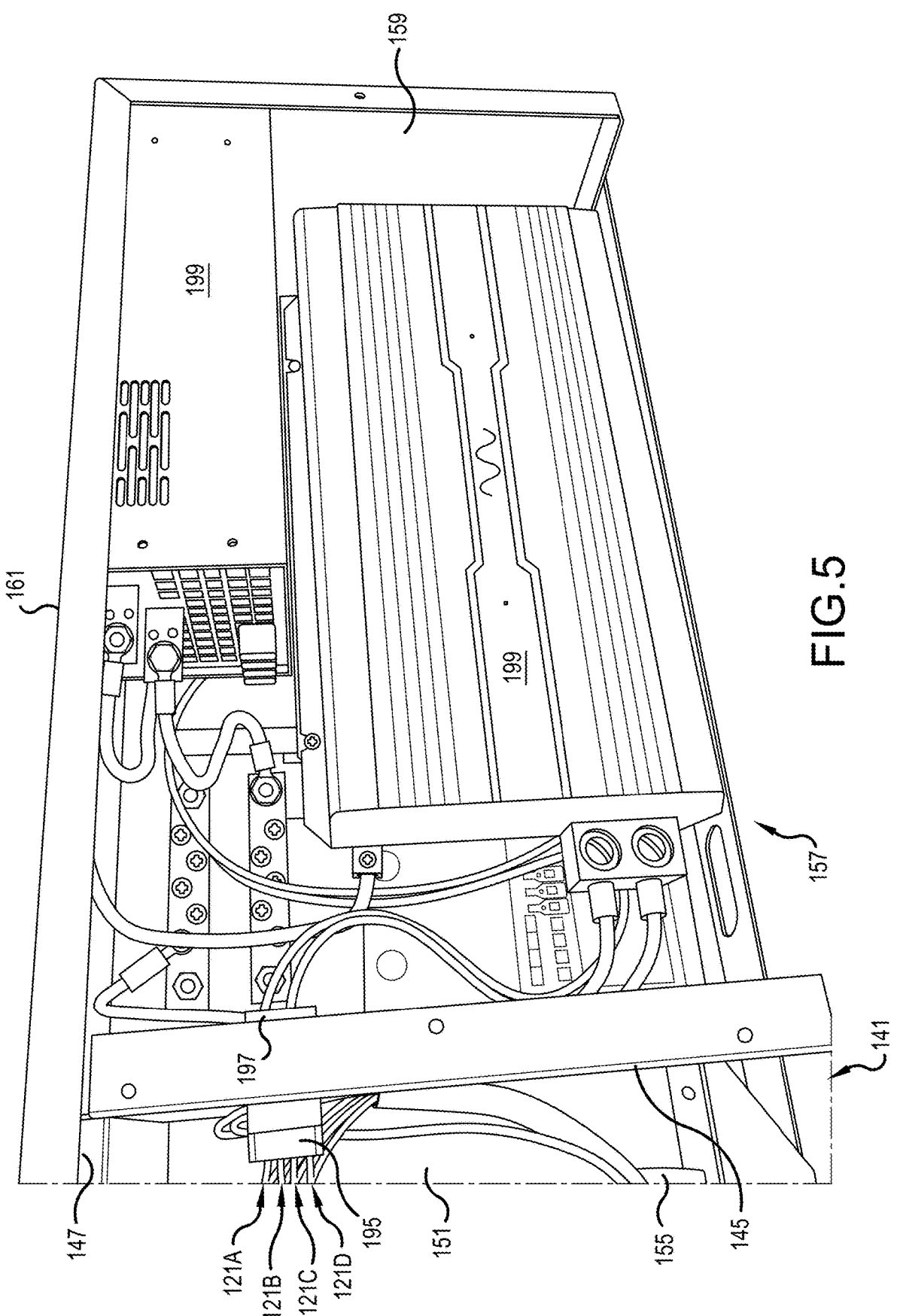
FIG. 5 is a rear view of the power conversion compartment and power connection compartment with rear walls removed.

FIG. 5 is a rear view of the power connection compartment 141 and power conversion compartment 157 with the back walls 153 and 167 removed. Power lugs are mounted within the first partitioning wall 145 with first terminals 195 residing within the first volume of the power connection compartment 141 to receive power from the insulated electrical conductors 121 of the hybrid cable 117, e.g., first, second, third and fourth insulated wires 121A, 121B, 121C and 121D. The power lugs have second terminals 197 residing within the second volume of the power conversion compartment 157 to receive wires from power conversion equipment 199. The first and second terminals 195 and 197 may be formed as spring loaded blades which establish electrical connectivity with conductors within insulated wires, screw down terminals for stripped or terminated wire ends, female socket terminals for male terminals attached to wire ends, etc.

The power conversion equipment 199 converts pulses of direct current voltage exceeding 300 volts into an output. The output may include one or more of a 120 volt alternating current (AC) signal, a 208 volt AC signal, a 240 volt AC signal, and a direct current (DC) signal with a voltage of less than 100 volts, such as a DC voltage of 5, 12, 24, 48 and/or 54 volts. As best seen in FIG. 4, power output ports 201 are mounted to the second partitioning wall 165 and the output of the power conversion equipment 199 is connected to the power output ports 201. In the depicted embodiment, the power output ports 201 include a plurality of 120 volt AC outlets 201A, and a plurality of DC power ports 201B providing at least one of 5, 12, 24, 48 or 54 volts. A switch 202 may be located beside the ports 201 to switch off the power provided to the ports 201. There may also be provided a data port, such as an RJ-45 port 204, which may be used to remotely check the power conversion equipment 199 as to operation status, fault codes, and optionally to reprogram or update software associated with the operation of the power conversion equipment 199. In the case of faults of the power conversion equipment 199, one or more circuit breakers may have resettable push buttons CB1 through CB6 accessible on the second side wall 159 of the power conversion compartment 157.

When the combination of the power connection compartment 141 and power conversion compartment 157 (FIG. 4) is mated and attached to the data connection compartment 169, the power output ports 201 are aligned to and accessible via a through hole 203 formed in the back wall 181 of the data connection compartment 169. In other words, connector-receiving features of the power output ports 201 face toward the third volume of the data connection compartment 169. The bottom wall 177 of the data connection compartment 169 has an access door 205 having one or more fasteners 207A and 207B to allow the access door 205 to be swung opened about a hinge 209 and/or removed from the hinge 209.

The fasteners 207A and 207B include at least one latching tab 211A and 211B rotatably mounted to the access door 205. The at least one latching tab 211A and 211B may be rotated to overlie a side of a ledge 177A of the bottom wall 177 facing toward the top wall 175 of the data connection compartment 169, so as to hold the access door 205 in a closed position. At least one handle 213A and 213B is connected to the at least one latching tab 211A and 211B and resides on an exterior surface of the access door 205. Rotation of the at least one handle 213A and 213B causes the at least one latching tab 211A and 211B to move free of the ledge 177A and allows the access door 205 to open downwardly away from the third volume of the data connection compartment 169. The access door 205 will hang open due to gravity.

The front wall 179 of the data connection compartment 169 is formed primarily as an access panel 179. The access panel 179 is secured to the data connection compartment 169 by at least two threaded fasteners, each with a finger knob, which may be formed as enlarged knurled heads 215A and 215B to enable finger manipulation for tool-less manual rotation, wherein each threaded fastener is engaged into a threaded bore hole 217A and 217B formed in a front-facing perimeter rim 179A of the data connection compartment 169 (See FIG. 7). The access panel 179 functions as a second access door and allows a technician, standing on a ladder with arms and head above a plane of a drop ceiling, a different line of access into the interior of the data connection compartment 169, which line of access is ninety degrees rotated from the downward facing access door 205 and hence may provide easier access to install/remove equipment and to make, add and change (MAC) cabling connectors with respect to ports.

The front-facing perimeter rim 179A may also include a through hole 180 within an upstanding wing 182. The through hole 180 is aligned to a panel threaded nut or rivet 184 welded, staked, or otherwise fixed to the access panel 179. When the access door 205 is open, a threaded faster such as a screw or which may be formed exactly like the first threaded fastener 183A with an enlarged knurled head to enable finger manipulation is inserted into the through hole 180 in the wing 182 and tightened into the panel threaded nut or rivet 182 of the access panel 179 until the head of the threaded fastener abuts the wing 182. In this manner, the access panel 179 cannot be removed until the threaded fastener is removed from inside the data connection compartment 169. If at least one handle 213A and/or 213B has a key locking feature to prevent rotation until a key is inserted into at least one handle 213A and/or 213B, then the entire data connection compartment 169 can be securely locked using the key.

Figure 6:
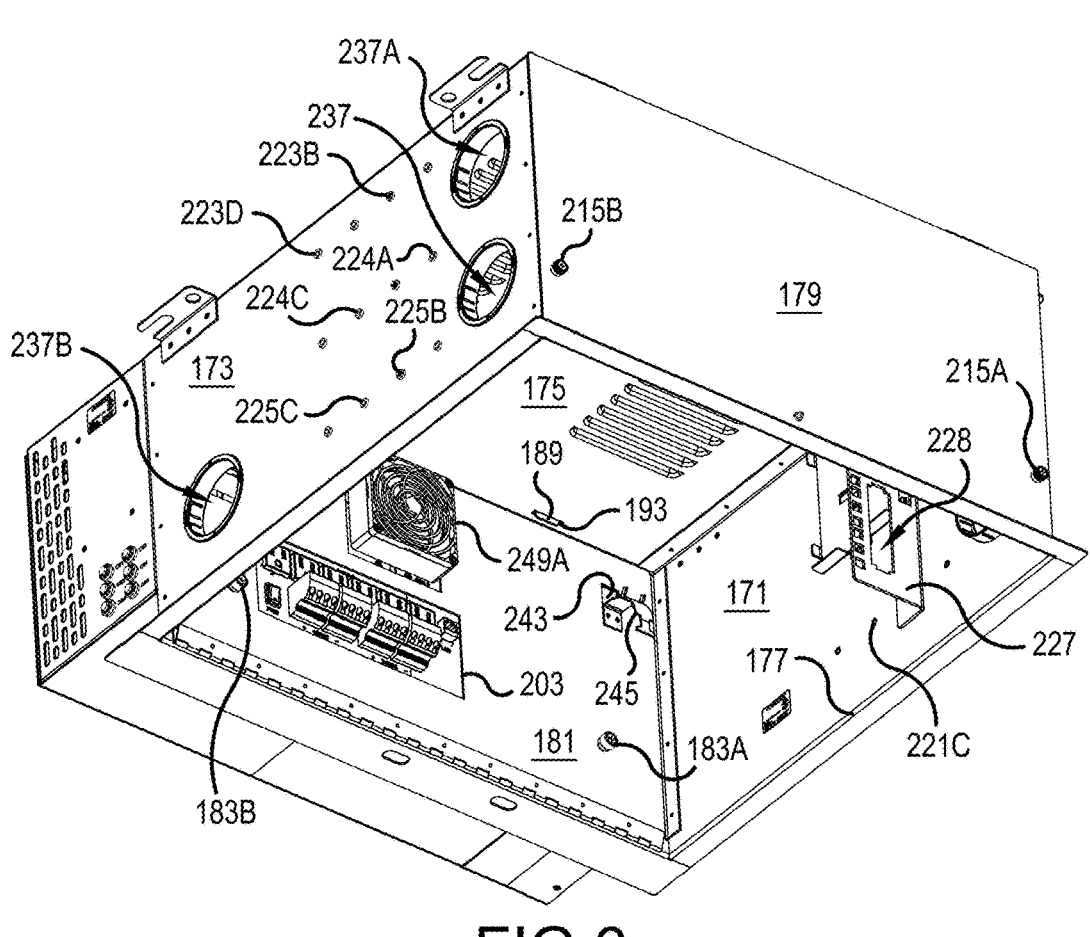
FIG. 6 is a front, bottom and second side perspective view of the enclosure of FIG. 3.
Figure 7:
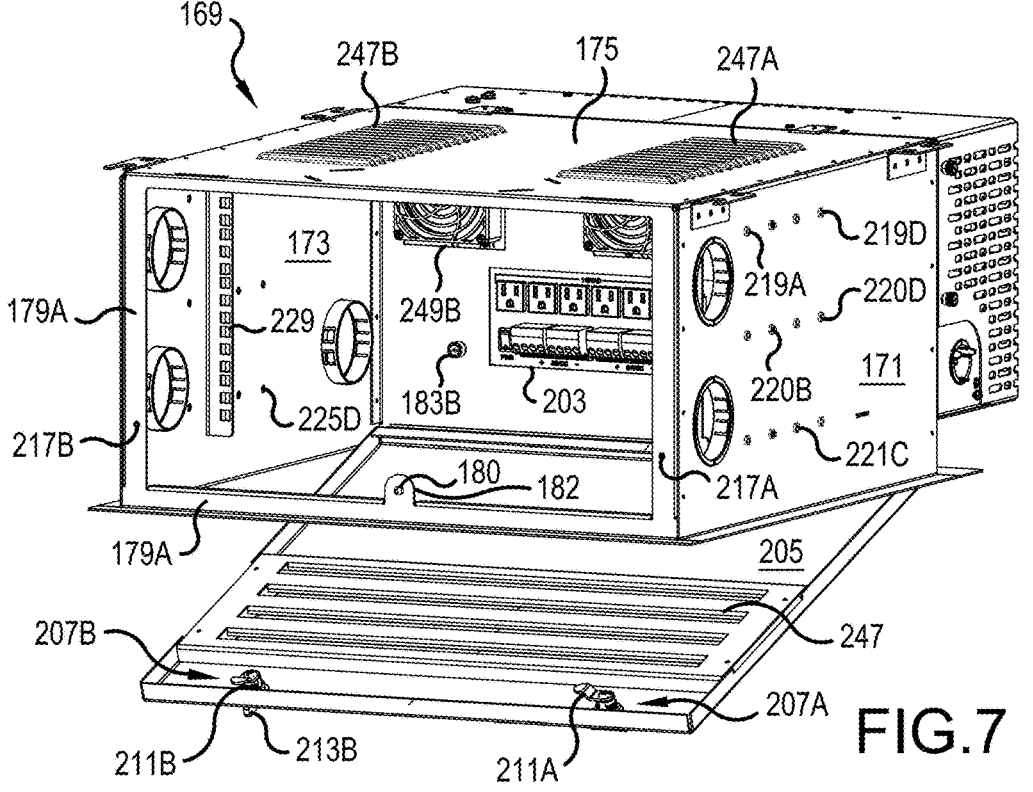
FIG. 7 is a front, top and first side perspective view of the enclosure of FIG. 2, with the cover to the power connection compartment installed.
Figure 8:
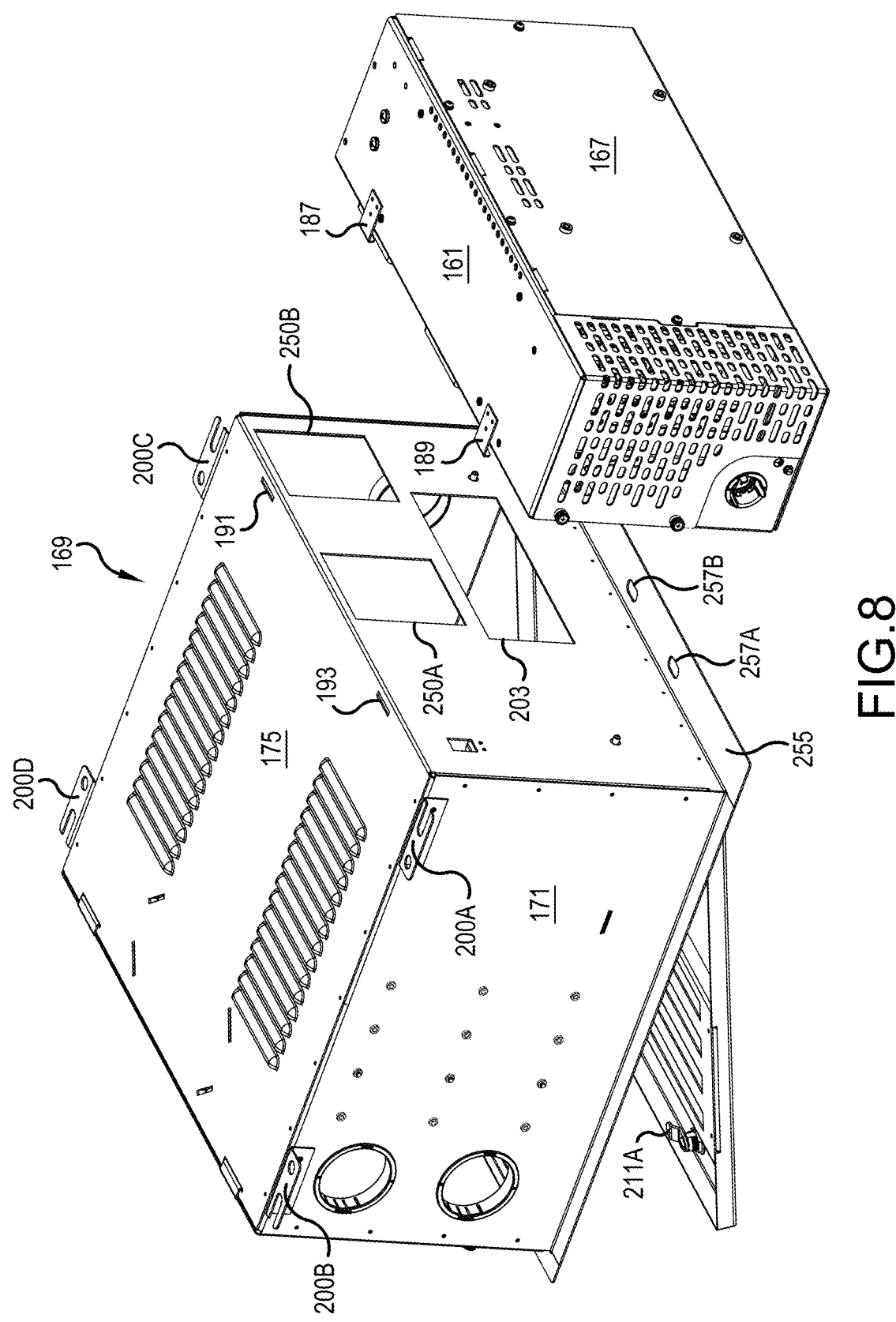
FIG. 8 is a rear, top and first side perspective view of the power connection compartment and power conversion compartment disconnected from, but adjacent to, the data connection compartment.

With reference to FIGS. 6 and 7, the first sidewall 171 of the third plurality of walls has a first line of a plurality of first threaded nuts or rivets 219A-219Dwelded, staked, or otherwise fixed to the first sidewall 171, a second line of a plurality of second threaded nuts or rivets 220A-220D welded, staked, or otherwise fixed to the first sidewall 171, and a third line of a plurality of third threaded nuts or rivets 221A-221D welded, staked, or otherwise fixed to the first sidewall 171. The second sidewall 173 of the third plurality of walls has a fourth line of a plurality of fourth threaded nuts or rivets 223A-223D welded, staked, or otherwise fixed to the second sidewall 173, a fifth line of a plurality of fifth threaded nuts or rivets 224A-224D welded, staked, or otherwise fixed to the second sidewall 173, and a sixth line of a plurality of sixth threaded nuts or rivets 225A-225D welded, staked, or otherwise fixed to the second sidewall 173. The plurality of first threaded nuts or rivets 219A-219D of the first line are aligned to the plurality of fourth threaded nuts or rivets 223A-223D of the fourth line. Also, the plurality of second threaded nuts or rivets 220A-220D of the second line are aligned to the plurality of fifth threaded nuts or rivets 224A-224D of the fifth line. Furthermore, the plurality of third threaded nuts or rivets 221A-221D of the third line are aligned to the plurality of six threaded nuts or rivets 225A-225D of the sixth line.

A first L-shaped bracket 227 is attached to threaded nuts or rivets 219B, 220B and 221B by threaded fasteners, which may be formed exactly like the first threaded fastener 183A if desired. A second L-shaped bracket 229 is attached to threaded nuts or rivets 223B, 224B and 225B by threaded fasteners, which may be formed exactly like the first threaded fastener 183A if desired. Protruding threaded ends of the threaded fasteners are visible in FIGS. 6 and 7. It should be noted that the first and second L-shaped brackets 227 and 229 may be mounted to other ones of the threaded nuts or rivets to adjust a placement.

In a preferred embodiment, one of the first and second L-shaped brackets 227 and 229, such the first L-shaped bracket 227, has one or more cutouts 228. A perimeter edge of the cutout 228 serves as a bezel. A module, such as a patching module with one or more ports on the back and one or more ports on the front face, can be inserted in the opening and resilient features on the sides of the module can snap capture the perimeter edge of the cutout 228.

Figure 9:
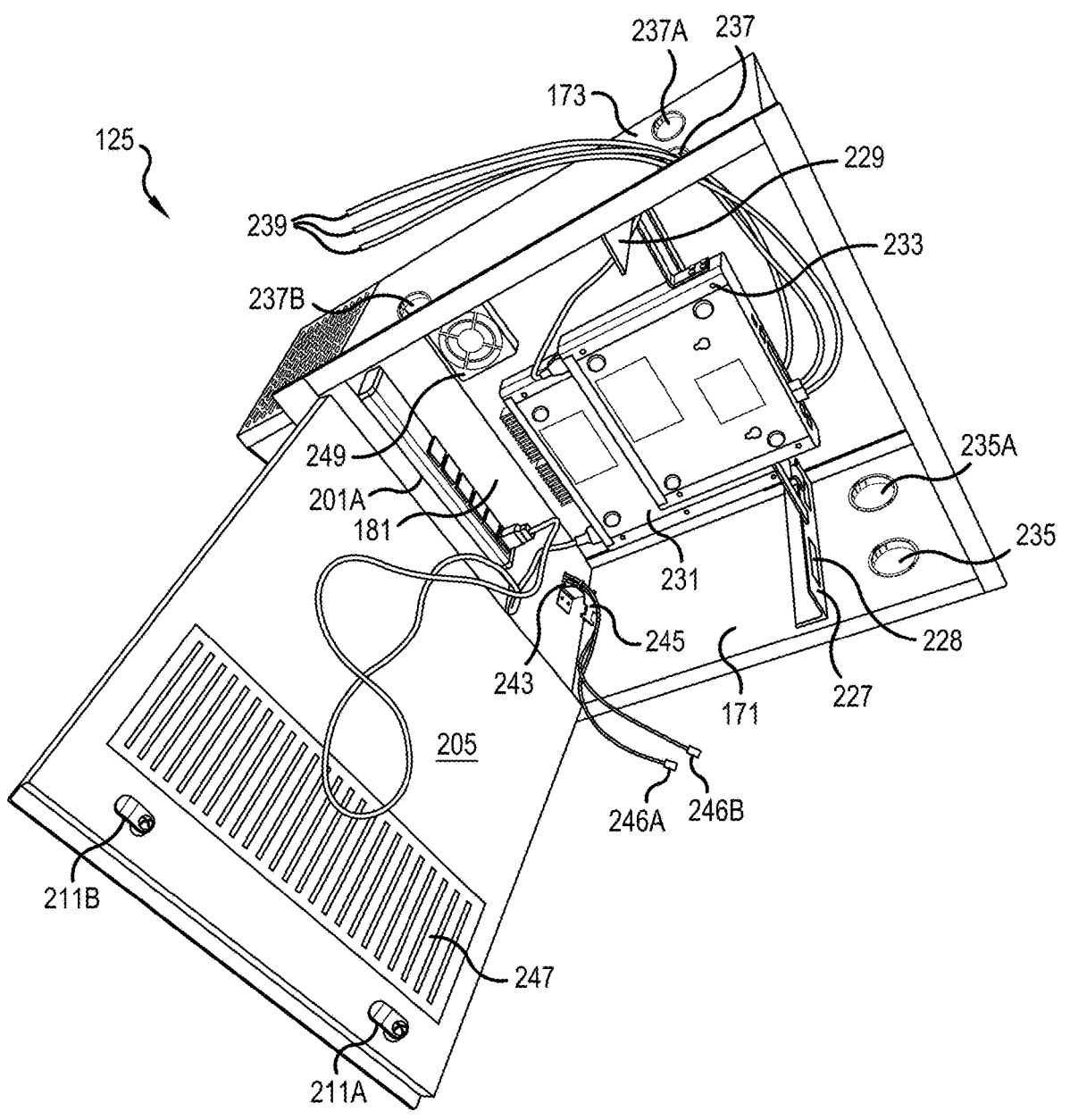
FIG. 9 is a bottom view of the data connection compartment with equipment mounted therein.

As best seen in FIG. 9, data communication equipment units 231 and 233 are mounted to the first and second L-shaped bracket 227 and 229 within the data connection compartment 169. The data communication equipment units 231 and 233 are powered by the 120 volt AC outlets 201A on the backwall 181 of the data connection compartment 169. The data communication equipment units 231 and 233 may be switches, which have one or more optical ports to receive and transmit optical communication signals, many RJ-45 jacks to transmit and receive electrical communication signals, optical-to-electrical (O/E) and electrical-to-optical (E/O) conversion units to translate signals between the electrical and optical domains, and optionally, power insertion equipment to insert a power over ethernet (POE) signal onto the electrical jack wires of the RJ-45 jacks. The RJ-45 jacks communicate with one or more end user devices 133, 135, 137, 140 and 142 in FIG. 1.

First and second cutouts 235 and 235A are formed in the first sidewall 171 of the third plurality of walls to allow twisted pair cabling 239 or optical cabling to pass from the data connection compartment 169 through the first sidewall 171. Third, fourth and fifth cutouts 237, 237A and 237B are formed in the second sidewall 173 of the third plurality of walls to allow twisted pair cabling 239 or optical cabling to pass from the data connection compartment 169 through the second sidewall 173. The first through fifth cutouts 235, 235A, 237, 237A and 237B may be fitted with edge protection devices, like bend limiters to protect the twisted pair cabling 239 from cuts and ceases against the metal edges of the first through fifth cutouts 235, 235A, 237, 237A and 237B.

As best seen in FIGS. 4 and 6, the front wall 151 of the first plurality of walls includes a first passthrough opening 241, which aligns to a second passthrough opening 243 formed in the backwall 181 of the third plurality of walls. A bend limiter 245 covers one or more edges of the first passthrough opening 241 and the second passthrough opening 243. Suitable bend limiters can be found in U.S. Pat. Nos. 6,044,194; 6,271,476; 6,535,681; 6,546,179 and 9,146, 375, each of which is herein incorporated by reference.

The bend limiter 245 protects the one or more optical fibers of the fiber cable subunits 119 at a first end of the hybrid cable 117, as the fiber cable subunits 119 are routed from the power connection compartment 141 into the data connection compartment 169. The bend limiter 245 protects the fiber cable subunits 119 from cuts on the metal edges and ensures that the one or more optical fibers do not exceed a minimum bend radius. Preferably, the ends of the one or more optical fibers are pre-terminated to one or more optical connectors 246, like MPO connectors 246A, LC-duplex connectors 246B, SC connectors and/or ST connectors. The one or more optical connectors 246 are then plugged into one or more optical ports on one or more of the data communication equipment units 231 and 233 and/or to the modules snapped into the openings 228 of the first L-shaped bracket 227.

Devices which consume electrical energy generate heat. Hence, the enclosure 125 of the present invention has several features to dissipate heat from its internal components. Of primary note is a first vent opening 247 formed within the bottom wall 177 of the third plurality of walls or the access door 205 attached to the bottom wall 177. In the depicted embodiment, the first vent opening 247 is placed in the access door 205 near the one or more fasteners 207A and 207B. However, the first vent opening 247 may optionally be placed near the hinge 209 or proximate a center portion of the access door 205. The first vent opening 247 communicates air external to the data connection compartment 169 with air inside the third volume. Second and third vent openings 247A and 247B may be provided in the top wall 175 of the third plurality of walls to communicate air external to the data connection compartment 169 with air inside the third volume.

In an optional embodiment shown in FIG. 9, at least one fan 249 is mounted to the top wall 175 of the third plurality of walls. The at least one fan 249 moves air from the third volume to an exterior of the data connection compartment 169, e.g., above the enclosure 125 or into a return duct of the HVAC system of the office building 105. The fan 249 may optionally be thermostatically controlled and optionally powered by one of the DC power ports 201B. The vent openings 247, 247A and 247B and optional fan 249 deal with the heat generated in the data connection compartment 169.

Heat will also be generated in the power conversion compartment 157 due to the energy consumption of the power conversion equipment 199. To expel heat generated in this section of the enclosure 125, the back wall 153, entrance wall 143 and first partitioning wall 145 of the power connection compartment 141 and the second side wall 159 and back wall 167 of the power conversion compartment 157 may include vent holes 251 to allow air circulation. The vent holes 251 in the first partitioning wall 145 are visible in FIG. 2. The vent holes 251 allow air outside the enclosure 125 pass into and out of said first and second volumes.

The air flow through the vent holes 251 may be by natural convection. However, in a preferred embodiment, first and second fans 249A and 249B are provided and powered by the power conversion equipment 199. As illustrated, the fans 249A and 249B are attached to the front wall 165 of the power conversion compartment 157 and enter into the data connection compartment 169 along the back wall 181 of the data connection compartment 169 via first and second fan cutouts 250A and 250B. The first and second fans 249A and 249B pass air through the second and third volumes to cool the data communication equipment units 231 and 233 and the power conversion equipment 199. If one of the first or second fans 249A or 249B needs replacement, screws 252 which mount the fans 249A and 249B to the front wall 165 of the power conversion compartment 157 may be removed to exposed a pigtail electrical connection with a connector, which may be unplugged. In this manner, a replacement fan 249A or 249B may be easily installed from within the data connection compartment 169 while the power conversion compartment 157 remains attached to the data connection compartment 169.

While the fans 249A and 249B are externally mounted to the power conversion compartment 157 and may be user serviceable, the internal devices within the power conversion compartment 157 are not considered to be user serviceable. Therefore, the top wall 161, bottom wall 163, first and second sidewalls 145 and 159, and front and back walls 165 and 167 of the second plurality of walls, are either integrally formed, welded together or secured together with security fasteners. Security fasteners may be defined as tamper-resistant fasteners, like a tamper resistant torx fastener or rivets. In other words, fasteners which cannot be easily opened with a screwdriver, standard or metric socket, an Allen key, torx bit or other common tool.

To determine a fault within the power conversion compartment 157, one or more of the units of the power conversion equipment 199 have error indicators or LEDs on the outside of the housings. As best seen in FIG. 2, the bottom wall 163 of the power conversion compartment 157 has first and second cutout sections 253A and 253B. A trim flange 255, surrounding the access door 205, has third and fourth cutout sections 257A and 257B aligned with the first and second cutout sections 253A and 253B, respectively. Flexible light carrying filaments pipe the light from the error indicators of the power conversion equipment 199 to the first and second cutout sections 253A and 253B.

A person standing directly beneath the third and fourth cutout sections 257A and 257B of the enclosure 125 can see the colors and/or blinking rates and/or sequencies of the error indicators, e.g., solid green lights meaning functioning as intended, no lights meaning loss of power input signal, blinking red once per second meaning overheating condition, blinking in intervals of three in green meaning waiting for synchronizing signal from source, etc.

Should a failure occur within the power conversion compartment 157, the intended method of repair would be removing and replacing the defective power conversion compartment 157 and power connection compartment 141 as a unit. A replacement unit, on hand, is installed onto the data connection compartment 169. The defective unit is taken off site for a rebuild.

Figure 10:
FIG. 10 is a perspective view of the enclosure fitted into a drop ceiling.

FIG. 10 is a perspective view of the enclosure 125 fitted into a grid of drop ceiling tiles 259. Select ceiling tiles 259 are removed to illustrate the features of the invention. First and second primary support beams 261 and 263, e.g., first and second angled irons, are attached to the first and second sides walls 171 and 173 of the data connection compartment 169. The first and second primary support beams 261 and 263 are attached to the data connection compartment 169 at several of the holes 265 provided in the first and second sides walls 171 and 173, closer to the back wall 181 of the data connection compartment 169. This area will be close to a balancing point of the enclosure 125, yet provide flexibility to locate the first and second primary support beams 261 and 263 within holes 265 which underlie a support structure, e.g., a truss, a crossbeam, within the ceiling space above the drop ceiling tiles 259. Additionally, first and second supplemental support beams 267 and 269, such as first and second smaller angled irons, may also be attached to several of the holes 219A-219D, 221A-221D, 223A-223D and 225A-225D. The first and second supplemental support beams 267 and 269 provide balancing and additional support to the enclosure 125. In the illustrated embodiment, first through fourth mounting brackets 200A, 200B, 200C and 200D are attached to the first and second sidewalls 171 and 173 at the upper corners thereof, proximate the top wall 175. The support beams 261, 263, 267 and 269 may be interconnected by perpendicular cross beams, which get secured to the mounting brackets 200A, 200B, 200C and 200D. In such an instance, direct connection of the support beams 261, 263, 267 and 269 to the first and second side walls 171 and 173 may not be needed.

It is important to note that the primary support beams 261 and 263 and supplemental support beams 267 and 269 are only attached to the data connection compartment 169. In this manner, a defective power conversion compartment 157 and power connection compartment 141 may be removed as a unit without disturbing the connection of the enclosure 125 to the structural support structure within the ceiling space above the drop ceiling tiles 259. It is also important to note the gap 271, which exists between the bottom walls 149 and 163 of the power conversion compartment 157 and power connection compartment 141 and the top of the underlying drop ceiling tile 259. This gap 271 allows the underlying drop ceiling tile 259 to be lifted and slid onto a top of an adjacent drop ceiling tile, so that the technician on a ladder can remove the defective unit from the back wall 181 of the data connection compartment 169.

When removing a defective unit, the technician will need to cut off the power feed to the enclosure 125, disconnect the electrical conductors 121 from the first terminals 195, unplug the optical fiber cable subunits 119 from the data communication equipment units 231 and 233 and push/pull the optical fiber cable subunits 119 back through the bend limiter 245 and into the power connection compartment 141. The second end of the hybrid cable 117 is removed from the opening 155 in the entrance wall 143. The bend limiter 245 may optionally be removed from the first passthrough opening 241 if the bend limiter is attached over the edges of openings in both the power connection compartment 141 and the data connection compartment 169. The threaded fasteners 183A and 183B are removed. Then, the power conversion compartment 157 and power connection compartment 141 are removed as a unit by siding the two upward relative to the data connection compartment 169. Doing so, will cause the first and second tabs or hooks 187 and 189 to slide out of the first and second slots 191 and 193. The steps are performed in reverse to install the replacement unit.

During an initial installation of the enclosure 125, it is envisioned that an empty data connection compartment 169 would be first mounted to the support beams 261, 263, 267 and 269. The empty data connection compartment 169 includes no electronical devices. Only the empty data connection compartment 169 would be present while rough building construction is in progress, e.g., while the HVAC, plumbing and electrical and data wiring is installed in the ceiling area, and while the lighting and ceiling tiles 259 are installed. Afterwards, the more expensive and delicate power conversion compartment 157 and power connection compartment 141 may be installed as a unit onto the data connection compartment 169, and the data communication equipment units 231 and 233 may be installed into the data connection compartment 169. Such an installation ordering would reduce financial losses due to damage, theft or vandalism during initial construction.

With the present invention, backed-up power from the main equipment room 103 is provided to the enclosure 125 and powers the elements inside the enclosure 125. The enclosure 125 advantageously occupies no real estate on the office floor, because it is ceiling mounted. The data connection compartment 169 of the enclosure 125 is conveniently dimensioned to match the spacing of standard drop ceiling tiles 259, e.g., two feet by two feet plus or minus two inches. The data connection compartment 169 includes the trim flange 255 to integrate into the look of the drop tile ceiling, and also includes additional offset compartments 141 and 157 spaced above an adjacent drop ceiling tile 259.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. A communications consolidation enclosure comprising:
a power connection compartment including a first volume within a first plurality of walls, wherein said first plurality of walls includes an entrance wall which includes an opening to receiving at least one cable end and a first partitioning wall;
a plurality of power lugs mounted within said first partitioning wall with first terminals residing within said first volume to receive power from insulated wires of the at least one cable end;
a power conversion compartment including a second volume within a second plurality of walls, wherein said second plurality of walls includes said first partitioning wall and a second partitioning wall, wherein said plurality of power lugs mounted within said first partitioning wall have second terminals residing within said second volume;
power conversion equipment mounted within said second volume and being wired to said second terminals of said plurality of power lugs, wherein said power conversion equipment converts pulses of direct current voltage exceeding 300 volts into an output, said output including one or more of a 120 volt alternating current (AC) signal, a 240 volt AC signal, and a direct current (DC) signal with a voltage of less than 100 volts;
power output ports mounted to said second partitioning wall, wherein said output of said power conversion equipment is connected to said power output ports; and
a data connection compartment including a third volume within a third plurality of walls, wherein said third plurality of walls includes a back wall with an opening overlying said power output ports and a bottom wall with an access door having one or more fasteners to allow said access door to be opened or removed, wherein connector-receiving features of said power output ports face toward said third volume of said data connection compartment.

2. The enclosure according to claim 1, wherein said first plurality of walls further includes a back wall, and wherein said back wall, said entrance wall and said first partitioning wall all include vent holes to allow air circulation, such that air outside of said communications consolidation enclosure can pass into and out of said first and second volumes.

3. The enclosure according to claim 1, wherein said first plurality of walls further includes a front wall, and wherein said front wall of said first plurality of walls includes a passthrough opening to said data connection compartment to pass one or more optical fibers of the at least one cable end into said data connection compartment, and further comprising:
a bend limiter covering one or more edges of said passthrough opening so as to protect the one or more optical fibers from cuts and ensure that the one or more optical fibers do not exceed a minimum bend radius.

4. The enclosure according to claim 1, wherein said first terminals of said plurality of power lugs are formed by first spring loaded blades which contact and establish electrical connectivity with bare conductors of the insulated wires of the at least one cable end, and wherein said second terminals of said plurality of power lugs are formed by second spring loaded blades which contact and establish electrical connectivity with bare conductors of said power conversion equipment.

5. The enclosure according to claim 1, wherein said first partitioning wall is considered a first sidewall and said second partitioning wall is considered a front wall of said power conversion compartment, wherein said second plurality of walls further includes a second sidewall opposite to said first side wall, a back wall opposite to said front wall, a top wall and a bottom wall, wherein said first and second sidewalls of said second plurality of walls and said entrance wall of said first plurality of walls include vent holes to allow air circulation through said first and second volumes, and wherein said top wall, bottom wall, first and second sidewalls, and front and back walls of said second plurality of walls, are either integrally formed, welded together or secured together with security fasteners.

6. The enclosure according to claim 1, wherein said power output ports include a plurality of 120 volt AC outlets, and wherein said power output ports further include a plurality of DC power ports providing at least one of 5, 12, 24, 48 or 54 volts.

7. The enclosure according to claim 1, wherein at least one fan moves air from the third volume to an exterior of said data connection compartment or to said second volume.

8. The enclosure according to claim 7, further comprising:
a vent opening formed within said bottom wall or said access door of said bottom wall, said vent opening allowing air external to said data connection compartment to enter or exit said third volume.

9. The enclosure according to claim 1, further comprising:
at least one latching tab rotatably mounted to said access door, wherein said latching tab may be rotated to overlie a ledge of said bottom wall facing to said third volume to hold said access door in a closed position; and
a least one key lockable handle connected to said latching tab and residing on an exterior surface of said access door opposite to said third volume, wherein rotation of said handle causes said latching tab to move free of said ledge and allows said access door to open downwardly away from said third volume.

10. The enclosure according to claim 1, wherein said third plurality of walls includes a front wall, and said front wall is formed primarily by an access panel having at least two threaded fasteners, each with a hand knob to permit manual rotation, wherein each threaded fastener is engaged into a threaded bore hole formed in a perimeter rim of said front wall separate from said access panel.

11. The enclosure according to claim 1, wherein said third plurality of walls further includes a top wall, a front wall, a first side wall and a second side wall, opposite to said first sidewall;
wherein said first sidewall of said third plurality of walls has a first line of a plurality of first holes passing therethrough, and a second line of a plurality of second holes passing therethrough;
wherein said second sidewall of said third plurality of walls has a third line of a plurality of third holes passing therethrough, and a fourth line of a plurality of fourth holes passing therethrough; and
wherein said plurality of first holes of said first line are aligned to said plurality of third holes of said third line, and wherein said plurality of second holes of said second line are aligned to said plurality of fourth holes of said fourth line, and further comprising:
a first L-shaped bracket attached to a hole of said plurality of first holes and a hole of said plurality of second holes by first and second fasteners, respectively; and
a second L-shaped bracket attached to a hole of said plurality of third holes and a hole of said plurality of fourth holes by third and fourth fasteners, respectively.

12. The enclosure according to claim 11, further comprising:
data communication equipment mounted to said first and second L-shaped brackets and located within said data connection compartment, said data communication equipment being powered by said power outport ports, said data communication equipment having one or more optical ports to receive one or more optical connectors attached to one or more optical fibers of the at least one cable end, and said data communication equipment having a plurality of RJ45 ports to communicate with end user devices.

13. The enclosure according to claim 11, further comprising:
a first cutout formed in said first sidewall of said third plurality of walls to allow twisted pair cabling to pass from said data connection compartment through said first sidewall; and
a second cutout formed in said second sidewall of said third plurality of walls to allow twisted pair cabling to pass from said data connection compartment through said second sidewall.

14. A communications consolidation enclosure comprising:
a power connection compartment including a first volume within a first plurality of walls, wherein said first plurality of walls include an entrance wall which includes an opening to receiving at least one cable end and a first partitioning wall;
a plurality of first terminals mounted within said power connection compartment to receive power from insulated wires of the at least one cable end;
a power conversion compartment including a second volume within a second plurality of walls, second terminals residing within said second volume and being electrically connected to said first terminals;
power conversion equipment mounted within said second volume and being electrically connected to said second terminals, wherein said power conversion equipment converts pulses of direct current voltage exceeding 300 volts into an output, said output including one or more of a 120 volt alternating current (AC) signal, a 240 volt AC signal, and a direct current (DC) signal with a voltage of less than 100 volts;
power output ports receiving said output of said power conversion equipment; and
a data connection compartment including a third volume within a third plurality of walls, an access door having one or more fasteners to allow said access door to be opened or removed from said data connection compartment, wherein said third plurality of walls includes a wall with an opening sized to access said power output ports, and wherein said power conversion compartment can be mounted to said data connection compartment in order to place said power output ports into alignment with said opening.

15. The enclosure according to claim 14, wherein one side of said data connection compartment is a square shape with each side of said square shape being twenty-four inches, plus or minus two inches.

16. The enclosure according to claim 14, wherein said access door is a first access door, which is located in said one side of said data connection compartment, and further comprising:

a second access door formed in an adjacent side of said data connection compartment.

* * * * *